United States Patent [19]

Iannacone et al.

[11] Patent Number: 4,975,142

[45] Date of Patent: Dec. 4, 1990

[54] FABRICATION METHOD FOR PRINTED CIRCUIT BOARD

[75] Inventors: Joseph M. Iannacone, Bensalem, Pa.; Lawrence J. Ibbetson, Mount Laurel, N.J.

[73] Assignee: General Electric Company, Moorestown, N.J.

[21] Appl. No.: 433,066

[22] Filed: Nov. 7, 1989

[51] Int. Cl.$^5$ .............. B44C 1/22; C23F 1/02; C03C 15/00; B29C 37/00

[52] U.S. Cl. .................... 156/630; 29/852; 156/634; 156/644; 156/645; 156/656; 156/659.1; 156/902; 427/97

[58] Field of Search .............. 156/630, 634, 644, 645, 156/656, 659.1, 661.1, 666, 668, 901, 902; 29/846, 852; 174/68.5; 427/96, 97; 430/313, 317, 318; 361/395, 397, 400, 401, 403, 413; 204/15

[56] References Cited

U.S. PATENT DOCUMENTS

| | | | |
|---|---|---|---|
| 3,351,953 | 11/1972 | Sear | 156/630 X |
| 3,649,475 | 3/1972 | Degnan et al. | 156/630 X |
| 4,663,208 | 5/1987 | Ninomiya et al. | 156/902 X |

OTHER PUBLICATIONS

"PTFE Substrates Require Special Care in Fabrication" by Donegan, published in Oct., 1982 issue of Microwaves magazine.
"Grounding of Surface Mount Components" by Meier, published at pp. 17-20 of the Arp., 1989 issue of the periodical Surface Mount Technology.
"Miniaturized Microwave Packaging—A Different Game" by Markstein, published in the Aug., 1982 issue of Electronic Packaging and Production.
"Printed Circuit Integration of MW Filters" by Rooney et al., published at pp. 2-6 of the Microwave Journal and distributed by Rogers Corporation.
"Microwave Stripline Packaging with VMDS" by Traut, published in Microwave Journal, Aug. 1975.

*Primary Examiner*—William A. Powell
*Attorney, Agent, or Firm*—William H. Meise

[57] ABSTRACT

A double-sided printed circuit board includes a component side and a circuit side. The dielectric material is undesirably flexible. To render the board rigid, the conductor bonded to the component side is a rigid plate. At locations at which plated-through component signal leads are to be attached, lead clearance holes are drilled through all the way through the thin conductor, the dielectric, and the plate. The holes are plated with conductor. From the exposed side of the plate, larger holes are drilled coaxial with the clearance holes, part-way through the plate. The hold bottoms make an acute angle with the axes. The exposed surfaces are plated with etch resist. A second depth-controlled drilling coaxial with the first is performed with a drill which has a reverse-angle face, to a depth which extends almost through the plate, to thereby remove etch resist in an annular region surrounding the original clearance hole. The plate is etched sufficiently to free an annular region around each clearance hole from conductor.

6 Claims, 5 Drawing Sheets

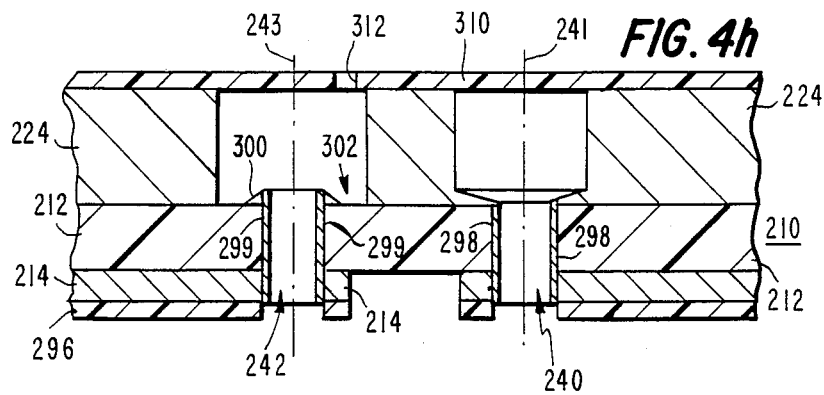
FIG. 4h
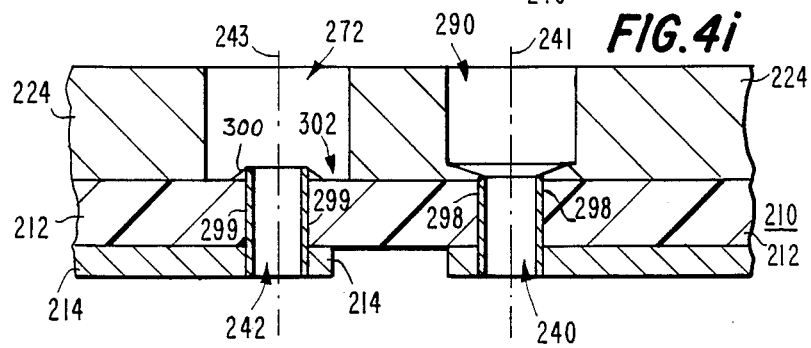
FIG. 4i
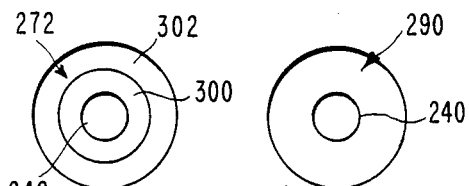
FIG. 4j
FIG. 4k

FABRICATION METHOD FOR PRINTED CIRCUIT BOARD

This invention relates to methods for making printed circuit boards, and more particularly to methods for making printed circuit boards using relatively flexible dielectric materials, with printed connections on one side and a conductive plate on the other.

Polytetrafluoroethane (PTFE) is a dielectric material which has been found to be advantageous for printed wiring boards used at radio frequencies or dielectric constant and low loss. The use of PTFE materials for printed circuit boards is described in the article "PTFE Substrates Require Special Care In Fabrication", by Donegan, published in the October 1982 issue of Microwaves magazine A disadvantage of PTFE material is that, unlike phenolic and epoxy materials, sheets of the thickness ordinarily used for printed circuit boards are relatively flexible The flexibility requires special attention to the support or attachment of the printed circuit board, and may require compression washers for the like to aid in preventing loosening of ground connections or heavy components. The problems of flexible board materials are described in the article "Grounding Of Surface Mount Components", by Meier, published at pages 17-20 of the April, 1989 issue of the periodical Surface Mount Technology. The flexibility is also disadvantageous when the finished assembly may be subjected to vibration, as in military or airborne equipment. Printed circuit boards are normally supported to a chassis at locations around the periphery of the board and possibly at interior locations. Between the support points, the board is free to flex.

The flexibility of PTFE printed circuit boards with double-sided one-ounce or two-ounce copper plating per square foot may be too great for certain applications. FIG. 1a is a perspective view, partially exploded, of a printed circuit board designated generally as 10 with a component 26. Printed circuit board 10 includes a PTFE substrate 12 with a thin plated copper ground plane or sheet 14 on the upper side and a similar copper plating designated generally as 16 on the bottom side, etched to form a pattern including a further ground connection 18, and a signal path including a trace 20 and a component lead bonding pad 22 at an end of lead 20. Because the interconnection circuit is defined by the etching of the lower side of printed circuit board 10, this side is often called the "circuit" side, while the upper side from which components are mounted is called the "component" side. Also illustrated in FIG. 1a is a relatively thick aluminum plate 24 adhesively attached to copper ground plane 14 by a layer 54 of conductive epoxy for thereby rendering the assembly more rigid. Hole 32 through copper ground plating 18, PTFE substrate 12, copper ground plating 14, epoxy layer 54 and aluminum plate 24 is a clearance hole for a mounting bolt.

Also in FIG. 1a, electrical component 26 includes first and second connection leads 28 and 30. Connection lead 28 is intended to be connected to ground plane 14 and to ground plane 18, and lead 30 is intended to be connected solely to lead 20 by way of bonding pad 22. Signal lead 30 when assembled extends through a hole 34 formed in bonding pad 22. Hole 34 is plated through PTFE substrate 12 and electrically interconnects bonding pad 22 with ground plane 14. Lead 28 in the assembled state extends through a hole 36 formed through ground plane 18, PTFE substrate 12 and ground plane 14. Hole 36 is plated through to make connection between ground plane 14 and ground plane 18.

FIG. 1b illustrates the arrangement of FIG. 1a in its assembled form, viewed from the upper surface. Elements of FIG. 1b corresponding to those of FIG. 1a are designated by the same reference numerals. In FIG. 1b, leads 28 and 30 extend through oversize or clearance holes 40 and 42, respectively, formed in aluminum plate 24. Hole 42 is provided so that signal lead 30 cannot touch aluminum plate 24, which may be at ground potential. Since lead 28 is at ground potential by virtue of being connected to upper and lower ground planes 14 and 18, respectively, one might imagine that a hole corresponding to hole 42 would not be necessary for lead 28. However, a clearance hole 40 is necessary for effective soldering of lead 28 to ground planes 14 and 18. If hole 40 were of the same size as hole 36, it might provide a path, during wave-soldering of the circuit side, by which wicking of the solder might tend to proceed beyond the plated-through portion of hole 36 extending from ground plane 18 to ground plane 14. The relatively large heat capacity and low temperature of aluminum plate 24 would tend to impede the bonding of such wicked solder or cause its crystallization. Even if wicking did not tend to occur, if aluminum plate 24 were to contact component lead 28, it would tend to prevent lead 28 from achieving the high temperature necessary for good solder bonding.

In FIG. 2, elements corresponding to those of FIG. 1 are designated by the same reference numerals. FIG. 2 illustrates certain portions of the arrangement of FIG. 1 in exploded form. FIG. 2a illustrates a perspective view of the bottom of aluminum plate 24, illustrating clearance holes 40 and 42, and that portion of mounting hole 32 which passes through plate 24. FIG. 2b illustrates, in perspective view, the upper portion of substrate 12 and ground plate 14. FIG. 2b illustrates that portion of mounting hole 32 which passes through substrate 12, epoxy layer 54 and ground planes 14 and 18, and also illustrates the upper side of hole 36, which when assembled is coaxial with hole 40. Hole 36 is plated through, providing a continuous path between upper ground plane 14 and lower ground plane 18 (FIG. 1a). Such plated-through holes provide better support for component lead than non-plated-through holes, and may be required for certain high-reliability applications. In FIG. 2b, a clearance hole 46 coaxial with and surrounding hole 34 prevents contact between the signal-carrying electrical conductors and ground plate 14. An annular conductive bonding pad 33 is illustrated partially cut away to illustrate its attachment to plating 48, which is part of the plated-through hole which extends through hole 34. When assembled, clearance hole 42 in aluminum plate 24 matches clearance hole 46. The structure illustrated in FIG. 2b may be processed using standard printed-circuit techniques.

Aluminum plate 24 in FIG. 2a is mated to upper surface of ground plane 14 of FIG. 2b by the use of an electrically nonconductive adhesive such as epoxy. The aluminum plate stiffens the resulting composite printed circuit board, and allows components to be mounted from the "component" side, whereby the "circuit" side (which as mentioned is the underside illustrated in FIGS. 1 and 2), may be passed through a standard wave soldering apparatus for low cost assembly. If desired, the components, such as component 26 illustrated in FIG. 1, may be clamped to the upper surface of aluminum plate 24 to enhance heat transfer away from the component toward a thermal sink (not illustrated). FIG. 3 illustrates a cross section through a component mounted on a composite printed circuit board such as that described in conjunction with FIGS. 1 and 2. In FIG. 3, elements corresponding to those of FIGS. 1 and 2 are designated by the same reference numerals. In FIG. 3, component 26 is illustrated in outline as a transistor, a mounting plate 49 of which is clamped against the upper surface of conductive plate 24 by a screw 50, which passes through mounting hole 32 and screws into a mounting post 52. Mounting post 52 bears against the lower side of ground plating 18. As also illustrated in FIG. 3, conductive plate 24 is mounted to the upper surface of ground plane 14 by means of a nonconductive epoxy 54. The thickness of epoxy 54 may vary, so that the lower surface of conductive plate 24 may make electrical contact with the upper surface of ground plane 14 at various points, such as point 56. Also, if any burrs remain from the drilling of holes 34 or 36, or 40 or 42, the burrs may penetrate through epoxy 54 to make contact. Even if epoxy 54 is rendered conductive by the addition of a solid conductive filler such as silver particles, the contact such as at point 56 will tend to change the impedance of the ground paths. Such uncontrolled ground plane connections may be disadvantageous as described in the aforementioned Meier article, and should be avoided in any manufacturing process making production quantities as opposed to one-of-a-kind items.

In addition to problems with the repeatability of the ground impedance, the structure of FIG. 3 may suffer from loosening of printed circuit board from mounting posts such as post 52. This occurs because PTFE substrate 12 is relatively soft, and tends to deform under the pressure imposed by screw 50. This deformation may change the dimensions of the printed circuit board, thereby changing the capacitances or impedances of the conductors, adversely affecting performance. More importantly, the PTFE tends to flow, so that the deformation due to the pressure of screw 50 tends to continue, until no pressure remains, i.e., the screw is loose. When this occurs, the board is not securely supported and may fail under conditions of vibration.

The Microwave Materials division of Rogers Corporation, 100 S. Roosevelt Avenue, Chandler, Ariz. 85226, fabricates a printed-circuit board material which is illustrated in cross section in FIG. 4a. In FIG. 4a, a glass-filled RT-DUROID (PTFE) dielectric substrate 212 has bonded thereto on one side, illustrated as the lower side, a layer 214 of electrolytically deposited copper, ranging in weight from about one-half ounce to about two-ounce The thickness of this plating may be a few thousandths of an inch. A cold-rolled 0.62 inch copper plate 224 is bonded to the other side, illustrated as the upper side, of dielectric substrate 212. These printed circuit boards are used for the surface mounting of components on the circuit side, i.e., in side bearing thin copper sheet 214. This mounting method is not as amenable to wave soldering as is the structure described in conjunction with FIGS. 1–3, and the components so mounted cannot be directly thermally sunk to thick conductive plate 224. A method is desired for using laminates with thick conductive plates for rigidity whereby they may be used with components which mount from the side opposite the circuits side and are amenable to wave soldering, yet with high-reliability products

SUMMARY OF THE INVENTION

In accordance with the invention, first holes defining an axis are made through a laminated board including a dielectric material with a thin conductive layer affixed to its first broad side and a conductive plate fixed to the second broad side. The holes are made at locations at which plated-through signal leads are to be connected. At locations coaxial with or centered on the axes of the first holes, larger holes are drilled from the accessible or free side of the plate. The holes extend partially through the conductive plate and have a generally conical bottom surface inclined at an acute angle relative to the drill entrance end of the axis. At least the interior surfaces of the first and larger holes are coated with etch resist. A further drilling operation is performed from the accessible side of the conductive plate, coaxial with the axis of the first holes to enlarge the larger holes into third holes, the bottom surfaces which are inclined at an obtuse angle relative to the entrance end of axes of the first holes, thereby removing at least an annular portion of the etch resist centered on the axes at the bottom of the layer holes. Etchant is applied to at least the interiors of the first and third holes so as to etch through that portion of the conductive plate within the third holes which lies under the annular portion.

DESCRIPTION OF THE DRAWING

FIGS. 1a and 1b are together referred to as FIG. 1;

FIGS. 2a and 2b are jointly referred to as FIG. 2;

FIGS. 4a–k illustrate steps in the process of making a printed circuit board according to the invention, FIGS. 4a–k are together referred to as FIG. 4;

DESCRIPTION OF THE INVENTION

Figure 4A:
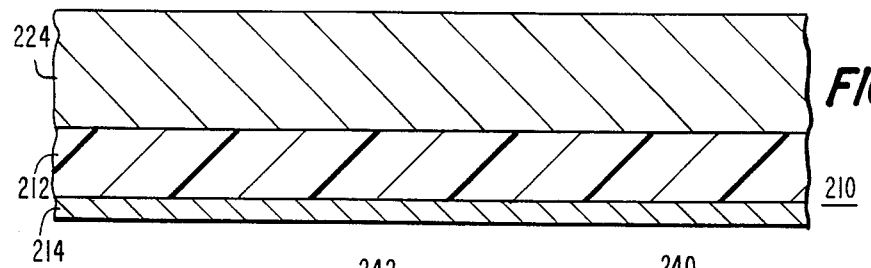
Figure 4B:
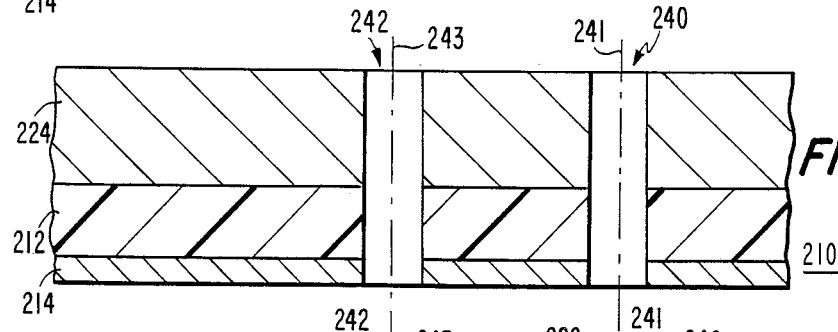

FIG. 4b illustrates the result of drilling holes through printed circuit board 210 of FIG. 4a. In FIG. 4b, a first through hole 240 has an axis 241, and a second through hole 242 has an axis 243. Through hole 240 is made at a location at which a plated-through ground-connected lead is to be placed, and hole 242 is made at a location at which a signal lead is to be soldered.

Figure 1A:
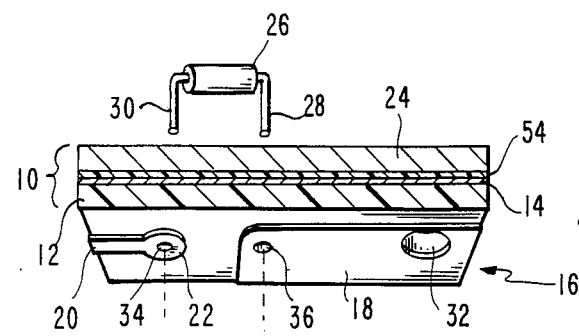
FIG. 1a is a perspective or isometric view of a composite printed circuit board and a component therefor, partially exploded for ease of understanding.
Figure 1B:
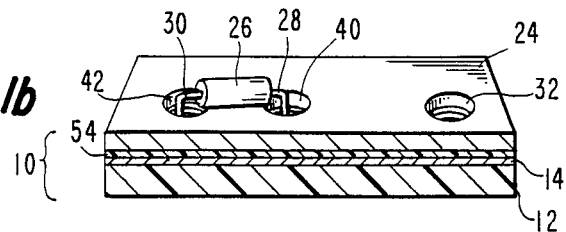
FIG. 1b is a perspective or isometric view of the assembled board as viewed from above.
Figure 2A:
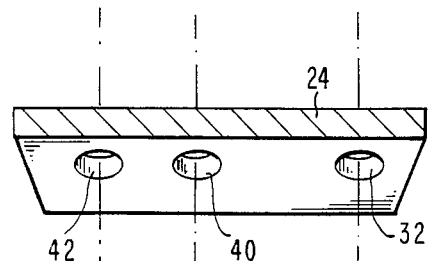
FIG. 2a is a perspective or isometric bottom view of the bottom of a conductive plate which is a part of the composite printed circuit board of FIG. 1.
Figure 2B:
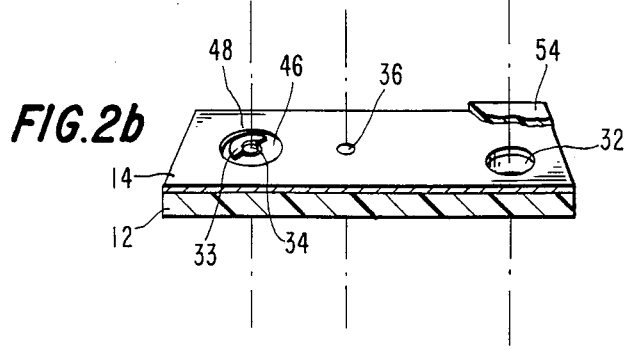
FIG. 2b is a perspective or isometric view of the upper surface of a dielectric substrate and conductive surface of the composite printed circuit board.
Figure 3:
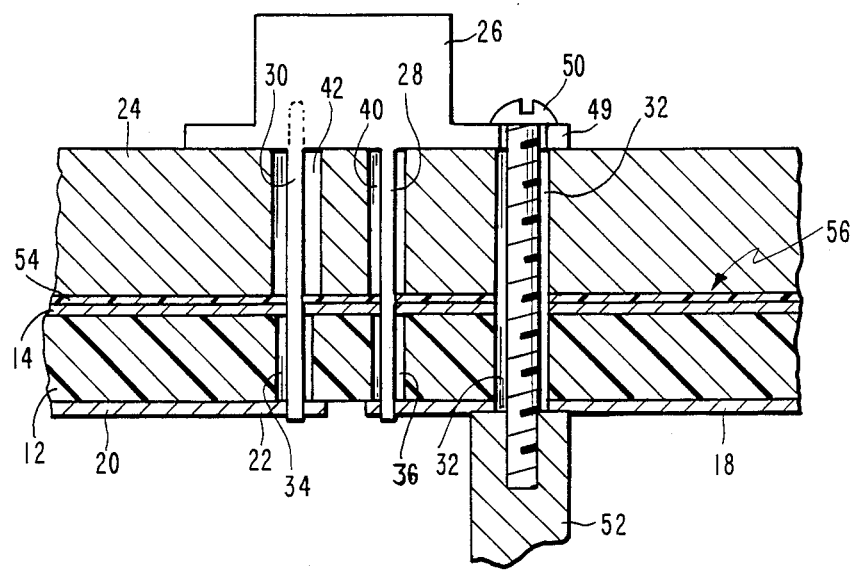
FIG. 3 is cross-sectional elevation view of a composite printed circuit board similar to that of FIGS. 1 and 2 in assembled form.
Figure 4C:
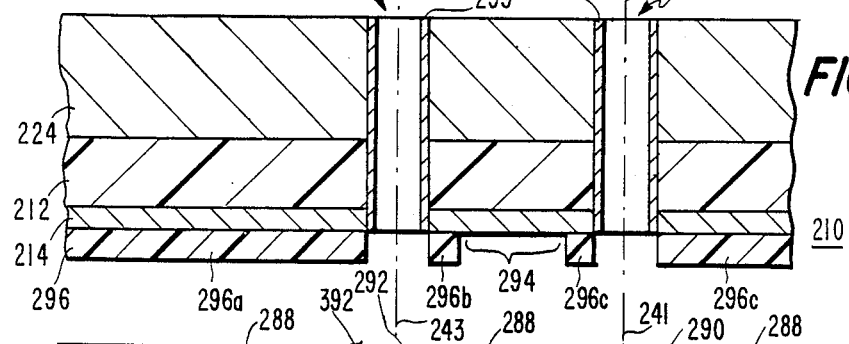

FIG. 4c illustrates the effect of plating within holes 240 and 242 as by electroless copper method followed by a plating process to form a layer of conductive copper material illustrated as 298 and 299 in holes 240 and 242, respectively. Further, FIG. 4c illustrates the result of applying a full layer of photoresist material illustrated as 296 over thin copper sheet 214 on the circuit side of printed circuit board 210, followed by negative photolithographic exposure and developing to define the circuit areas. In FIG. 4c, region 296a corresponds to signal lead 20 and a portion of bonding pad 22 of FIGS. 1 and 3, portion 296b corresponds to a part of bonding pad 22, and portions 296c defines ground portion 18. Copper sheet 214 in a region 294 will ultimately be etched away to aid in isolating the signal portions from the ground portions of the circuit to thereby define the copper circuit on the circuit side.

Figure 4D:
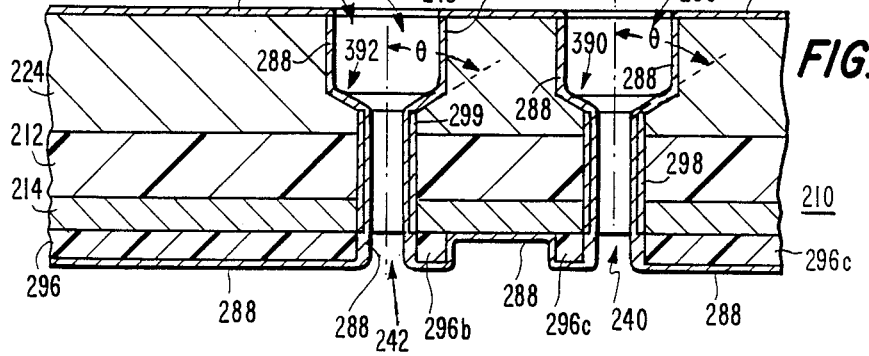

FIG. 4d illustrates the result of drilling holes 290 and 292 along axes 241 and 243 to a diameter larger than that of through holes 240 and 242. A transition region 390 extends between smaller diameter first through holes 240 and larger-diameter hole 290, and a transition region 392 extends between smaller hole 242 and the second, larger diameter hole 292. Transition regions 390 and 392 are each in the shape of a portion of a cone having an included angle $\theta$ which is less than 90° as measured from the side of axes 241 or 243 from which holes 290 and 292, respectively, are drilled. Thus, angle $\theta$ is acute when measured from the side of entry.

FIG. 4d also illustrates the result of plating the entire surface of the board, including the interior of holes or hole portions 240, 242, 290 and 292, with etch resist material. Such an etch resistant material might be tin-lead (SnPb) solder plate.

Figure 4E:
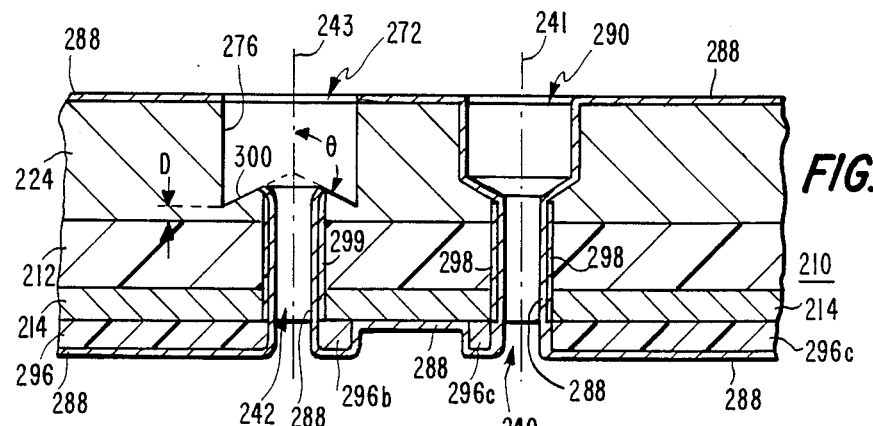

FIG. 4e illustrates the result of drilling out the holes for signal component leads. Ground-lead hole 290 is not drilled in this operation. Hole 292 of FIG. 4d is drilled slightly oversize to form a hole 272. While there is no compelling necessity for removal of the etch-resisting solder plate from wall 276, hole 272 is drilled sufficiently oversize to remove solder plate 288 from the walls. The drilling is performed with a drill bit (not illustrated) having a reverse cutting edge angle, so that hole 272 has a conical bottom surface portion 300. The angle between the reverse-angle conical surface 300 and the entry (upper) side of axis 243 is greater than 90°, and is therefore an obtuse angle.

Hole 272 is controlled in depth so that the deepest portion, namely the portion at the junction of cylindrical side 276 and reverse-angle conical bottom 300, is at a selected distance D from the PTFE substrate. Distance D is selected so that, ideally, three passes through an etching solution (described below) will etch through the remaining portion of copper plate 224 to expose the PTFE substrate in an annular region surrounding through hole 242.

In FIG. 4e, hole 290 is illustrated unchanged. Hole 290 is not drilled in the same manner as hole 292 (FIG. 4d), because hole 290 is intended to clear a ground lead of the component to be inserted. The ground lead does not have to be electrically isolated from the underlying ground plane 296c. Hole 290 prevents the component lead (not illustrated) intended to be soldered into plated-through hole 240 from forming a poor solder joint during wave soldering, by reducing the thermal connection (increasing the thermal resistance) between copper plate 224 and plated-through hole 240.

Following the step illustrated in FIG. 4e, a further coat of photoresist may be added over the bottom of the printed circuit board as the strength of the following etching solution may indicate, to achieve proper results.

Figure 4F:
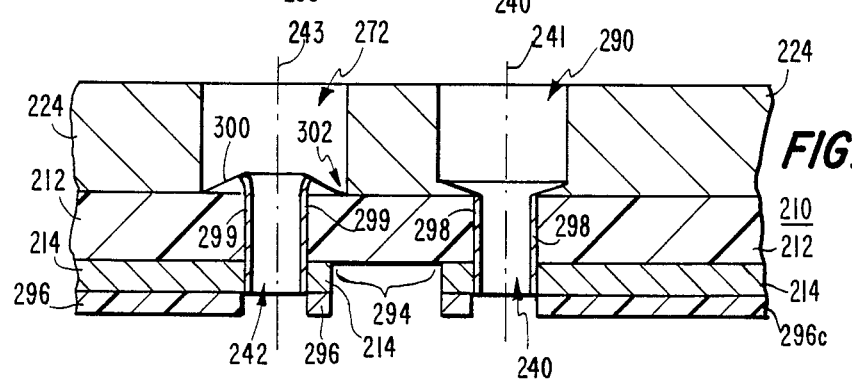

FIG. 4f illustrates the result of three passed of the printed circuit board through a bath of ammonia sulfate or other appropriate etching material. The etchant rapidly etches exposed copper, and etches the solder plate and photoresist more slowly. The principal results of etching are that the bottom surface 300 of hole 272 has been etched downward to expose an annular ring 302 of PTFE substrate 212, and copper layer 296 is etched away in those portions, such a portion 294, where the photoresist was removed during development (FIG. 4c). The exposing of annular ring 302 electrically isolates plating 299 of plated-through hole 242 from the ground potential ultimately developed on copper plate 224 and ground conductor 296c. Etching out of the copper in the pattern defined by the photoresist, as in region 294, defines the circuit side pattern on the underside of printed circuit board 210. The etching process also somewhat enlarges the cylindrical sides of reverse-angle drilled hole 272, but this has no significant effect. The etch also removes a portion of the photoresist and the solder plate, which will ultimately be removed anyway.

Figure 4G:
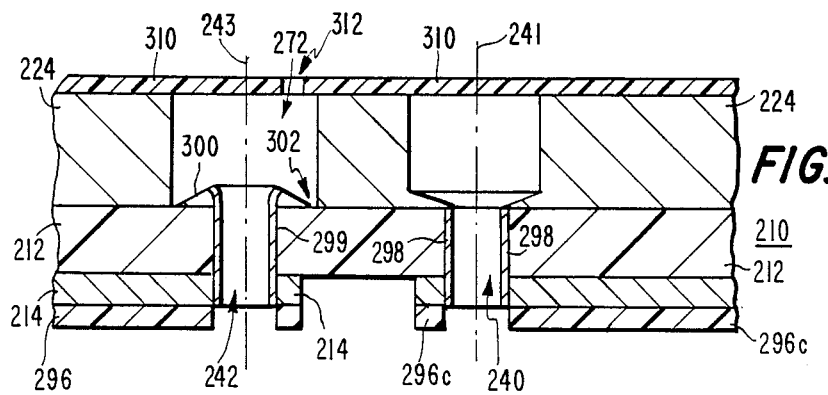

After three passes through the etching solution, the board is cleaned, and a clear sheet of plastic etch resist material 310, such as photoresist, is placed over the top of printed circuit board 210, as illustrated in FIG. 4g. The holes are examined from above through plastic sheet 310, and the sheet is punctured or broken over those holes intended for signal leads in which the etching has not proceeded sufficiently to clear a satisfactory annular ring 302. The breaking or puncturing of sheet 310 is illustrated in FIG. 4g by a hole 312. The board is once again passed through the bath of etching solution, which clears the annular region 302, and also finishes defining the circuit pattern in copper sheet 214. The air bubble trapped in those holes covered by the unbroken sheet keeps etchant out and prevents further etching. FIG. 4h illustrates printed circuit board 210 after the fourth etching solution path.

FIG. 4i illustrates the result of removal of etch resist sheet 310 and cleaning off of the etch resist 296. The circuit is defined in copper sheet 214. FIG. 4j is a plan view of holes 272 and 290 in the condition illustrated in FIG. 4i. In this condition, printed circuit board 210 is equivalent to composite board 10 of FIG. 1, ready for insertion of components.

FIG. 4k illustrates the result of drilling through printed circuit boards 210 with a screw clearance hole 320, and flat-face drilling from below through copper sheet 296 and through PTFE substrate 212 with a larger diameter drill, to clear a post such as post 52 of FIG. 3. This arrangement is extremely advantageous, because the mounting post bears only on copper plate 224 and creates no pressure on the PTFE. The components may be mounted on the upper or component side of copper plate 224, and may receive substantial mechanical support and thermal sinking from copper plate 224. Since copper plate 224 is a unitary piece bonded to the PTFE substrate, the grounding is uniform. The component-loaded board may be wave-soldered.

Other embodiments of the invention will be apparent to those skilled in the art. For example, while one signal lead and one ground lead for a single component have been described, printed circuit boards using hundreds of components, each with many signal and/or ground leads, may be used. Mounting may be by means of many posts such as the one described, or may be by other arrangements such as brackets. Heavy components may be mounted to the board by screwing to plate 224 without compressing the PTFE substrate. While glass-filled PTFE substrate material has been described, other substrate materials having similar properties may be used. Conductor materials other than copper may be used, such a silver. The fabrication process may include additional degreasing, scrubbing, cleaning, plating, stripping, etching, deburring, marking, routing, and silkscreening procedures as known in the art for transitioning between, to or from the described steps.

What is claimed is:

1. A method for making a rigid printed circuit board with a comparatively flexible dielectric material, said board including component signal lead holes, comprising the steps of:

forming first holes defining an axis through a blank board at locations at which component signal lead holes are desired, said blank board including a plate of said flexible dielectric material defining first and second broad sides, a thin conductive layer affixed to said first broad side and a conductive plate affixed to said second broad side, said conductive plate providing a major portion of the rigidity of the printed circuit board drilling at said locations from the accessible side of said conductive plate, coaxial with said axes of said first holes, to form second holes having a larger diameter than said first holes, each of said second holes extending partially through said conductive plate and having a generally conical bottom surface inclined at an acute angle relative to said axis;

covering at least the interior surfaces of said second holes with etch resist;

drilling at said locations from said accessible side of said conductive plate, centered on said axes of said first holes to enlarge said second holes into third holes, each of said third holes extending almost through said conductive plate, and having a conical bottom surface inclined at an obtuse angle relative to said axis to thereby remove at least an annular portion of said etch resist from said bottom of said third hole; and applying etching material to at least the interiors of said third holes so as to etch through that portion of said conductive plate overlying said second broad side of said dielectric plate and underlying said annular portion.

2. A method according to claim 1, wherein:
said covering step comprises the application of a layer of solder, and
said step of applying etching material comprises the step of applying an etchant which attacks copper in preference to solder.

3. A method according to claim 1 further comprising before said step of drilling to enlarge said second holes into said third holes, the step of applying a layer of conductor at least to the interior surfaces of at least said first and second holes, whereby said component signal lead holes are plated through, and also comprising in connection with said covering step, covering the interior of said first holes and said layer of conductor therein with etch resist.

4. A method according to claim 3, further comprising:
at locations at which plated-through component ground lead holes are desired, performing steps corresponding to said steps of forming, drilling to form second holes, applying a layer of conductor, covering, and applying etching material.

5. A method according to claim 1, further comprising:
at locations at which plated-through component ground lead holes are desired, performing steps corresponding to said steps of forming, drilling to form second holes, covering and applying.

6. A method according to claim 1 further comprising the steps of:
drilling screw clearance holes through said rigid printed circuit board at mounting locations; and
drilling through said flexible dielectric material and said thin conductive layer coaxial with said clearance holes to form a recess larger in diameter than said screw clearance holes.

* * * * *